(12) United States Patent
Zhong et al.

(10) Patent No.: US 11,694,322 B2
(45) Date of Patent: Jul. 4, 2023

(54) METHOD AND SYSTEM FOR IMAGING THREE-DIMENSIONAL FEATURE

(71) Applicant: FEI Company, Hillsboro, OR (US)

(72) Inventors: Zhenxin Zhong, Hillsboro, OR (US); Hai Fe Gao, Shanghai (CN); Ying Hong Lin, Shanghai (CN); Ruixin Zhang, Shanghai (CN); Bingxing Wu, Shanghai (CN)

(73) Assignee: FEI Company, Hillsboro, OR (US)

( * ) Notice: Subject to any disclaimer, the term of this patent is extended or adjusted under 35 U.S.C. 154(b) by 27 days.

(21) Appl. No.: 17/177,529

(22) Filed: Feb. 17, 2021

(65) Prior Publication Data

US 2022/0207698 A1  Jun. 30, 2022

(51) Int. Cl.
| | | |
|---|---|---|
| *G06T 7/00* | (2017.01) | |
| *G06T 7/33* | (2017.01) | |
| *H01J 37/28* | (2006.01) | |
| *B23C 3/00* | (2006.01) | |
| *G06T 7/73* | (2017.01) | |
| *G06V 10/25* | (2022.01) | |
| *G06V 10/40* | (2022.01) | |

(52) U.S. Cl.
CPC ............. *G06T 7/0004* (2013.01); *B23C 3/00* (2013.01); *G06T 7/33* (2017.01); *G06T 7/73* (2017.01); *G06V 10/25* (2022.01); *G06V 10/40* (2022.01); *H01J 37/28* (2013.01); *G06T 2207/10061* (2013.01); *G06T 2207/30108* (2013.01); *G06T 2207/30204* (2013.01)

(58) Field of Classification Search
CPC ........... G06T 7/0004; G06T 7/73; G06T 7/33; G06T 2207/10061; G06T 2207/30108; G06T 2207/30204; G06V 10/25; G06V 10/40; B23C 3/00; H01J 37/28
See application file for complete search history.

(56) References Cited

U.S. PATENT DOCUMENTS

| | | | |
|---|---|---|---|
| 9,633,819 B2 * | 4/2017 | Phaneuf | H01J 37/222 |
| 10,026,590 B2 | 7/2018 | Stone et al. | |
| 10,184,790 B2 | 1/2019 | Kawada et al. | |
| 10,498,948 B1 * | 12/2019 | Celik | G01B 11/002 |
| 2015/0348751 A1 * | 12/2015 | Brogden | H01J 37/3023 250/307 |
| 2018/0247793 A1 * | 8/2018 | Schmidt | H01J 37/3005 |
| 2020/0232785 A1 * | 7/2020 | Mosher | G06V 10/10 |
| 2022/0138973 A1 * | 5/2022 | Korb | G06T 7/35 382/151 |
| 2022/0223445 A1 * | 7/2022 | Avishai | H01J 37/222 |
| 2022/0254060 A1 * | 8/2022 | Najarian | G06T 7/33 |
| 2022/0392793 A1 * | 12/2022 | Buxbaum | G06T 7/0004 |

\* cited by examiner

*Primary Examiner* — Ian L Lemieux

(57) ABSTRACT

Methods and systems for milling and imaging a sample based on multiple fiducials at different sample depths include forming a first fiducial on a first sample surface at a first sample depth; milling at least a portion of the sample surface to expose a second sample surface at a second sample depth; forming a second fiducial on the second sample surface; and milling at least a portion of the second sample surface to expose a third sample surface including a region of interest (ROI) at a third sample depth. The location of the ROI at the third sample depth relative to the first fiducial may be calculated based on an image of the ROI and the second fiducial as well as relative position between the first fiducial and the second fiducial.

20 Claims, 8 Drawing Sheets

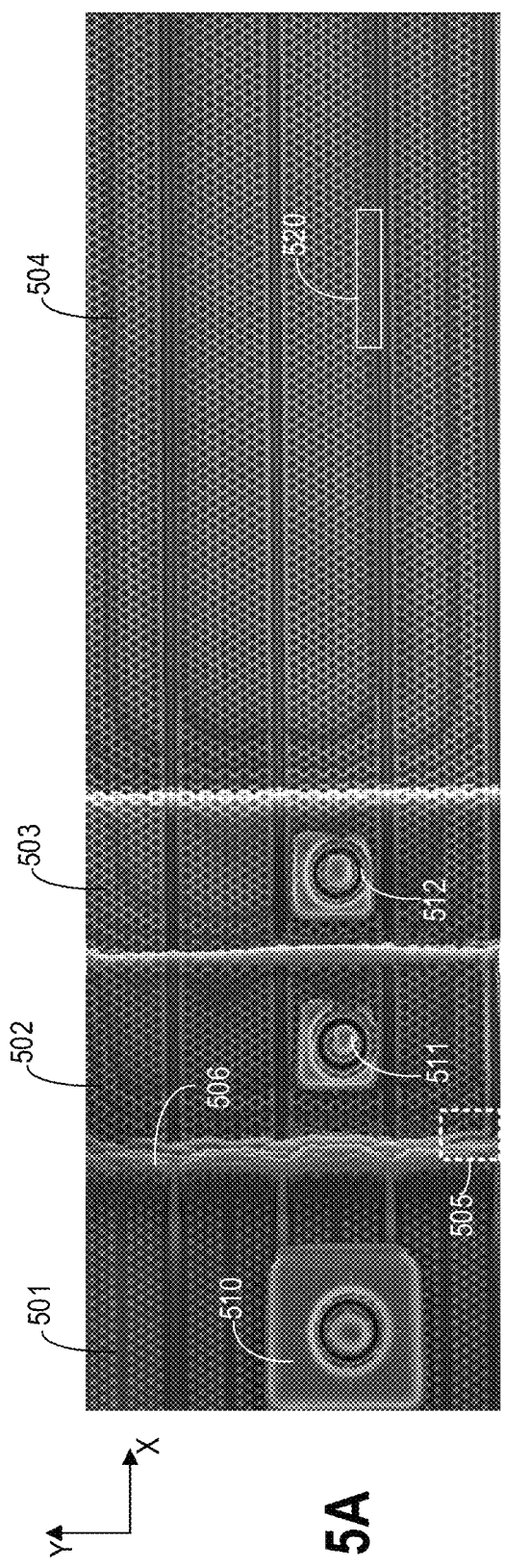
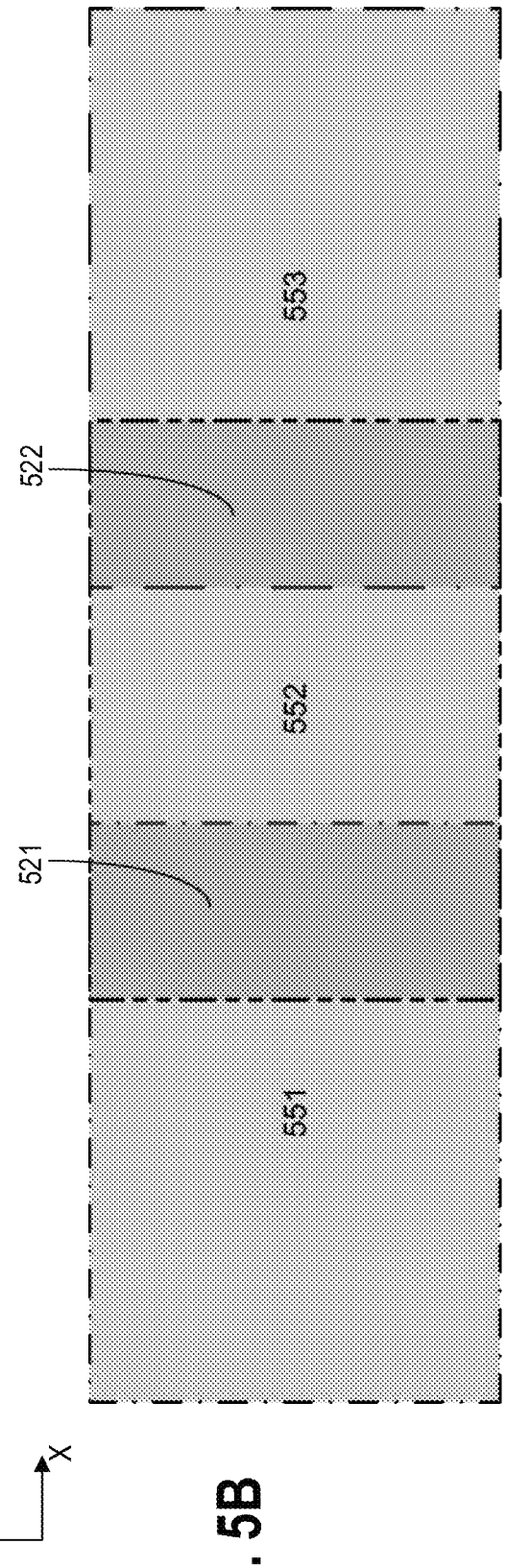
FIG. 5A
FIG. 5B

METHOD AND SYSTEM FOR IMAGING THREE-DIMENSIONAL FEATURE

FIELD OF THE INVENTION

The present description relates generally to methods and systems for imaging a three-dimensional feature within a sample, and more particularly, to generating three-dimensional feature profile using a charged particle microscopy system.

BACKGROUND OF THE INVENTION

Charged particle microscopy systems may be used for inspecting micro-fabricated devices. A dual beam system, which includes a focused ion beam (FIB) and an electron beam, can analyze defects and failures during micro-fabrication to trouble shoot, adjust, and improve the micro-fabrication processes. For example, the dual beam system may be used to reconstruct a three-dimensional feature within the sample through a slice-and-view process, wherein layers of material is removed from the sample using the FIB to expose multiple sample surfaces, and images of the exposed sample surfaces are taken using scanning electron microscopy (SEM). However, displacement of the feature in the SEM images due to factors including sample shift and beam drift may affect the accuracy of the reconstruction.

One method of determining location of the feature within the sample based on the slice-and-view data is shown in U.S. patent U.S. Pat. No. 7,348,556B2 by Chitturi et al., wherein a reference mark, referred to as fiducial, is created at the sample surface next to the feature of interest. Each SEM image acquired during the slice-and-view process includes the exposed sample surface as well as the surface fiducial. Positions of data point on each SEM image are measured based on a distance between the data point and the fiducial in the SEM image. However, Applicant recognizes that the distance between the feature and the surface fiducial may not be accurately measured in SEM image when the feature is deep in the sample.

SUMMARY

In one embodiment, a method comprises forming a first fiducial on a first sample surface at a first sample depth; removing at least a portion of the first sample surface to expose a second sample surface; forming a second fiducial on the second sample surface; removing at least a portion of the second sample surface to expose a third sample surface including a region of interest (ROI) at a third sample depth; acquiring a first sample image including the second fiducial and the ROI at the third sample depth; and determining a location of the ROI at the third sample depth relative to the first fiducial based on a first location of the first fiducial relative to the second fiducial and a second location of the ROI at the third sample depth relative to the second fiducial in the first sample image. In this way, location of a feature deep in the sample may be accurately measured.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

FIG. 5A is a scanning electron microscopy image of a sample processed by the method of FIG. 2.
FIG. 5B shows an example of forming FIG. 5A by stitching multiple images together.

DETAILED DESCRIPTION OF EMBODIMENTS

The following description relates to systems and methods for locating and reconstructing a feature within a sample based on images acquired with the slice-and-view technique. The sample may be milled and imaged using a charged particle microscopy system shown in FIG. 1. The charged particle microscopy system may be a dual beam system including a focused ion beam (FIB) for milling the sample and an electron beam (or e-beam) for acquiring high resolution sample image. In one example, after material of the sample is milled or removed using the FIB to expose a sample surface or a sample cross-section, a scanning electron microscopy (SEM) image the exposed surface is acquired with the e-beam. By repetitively milling and imaging the sample in a sample depth direction, series of SEM images of sample surfaces (or cross-sections) at various sample depths may be acquired. Three-dimensional volume of the sample may be reconstructed based on the SEM images. In order to align the SEM images in planes perpendicular to the sample depth direction, a reference mark, or a fiducial, may be located or formed on the sample's top surface. In one example, each SEM image of sample surface may include the surface fiducial for alignment. In another example, the e-beam location may be calibrated based on the surface fiducial before acquiring the SEM image. However, for features extending a long distance in the depth direction of the sample, such as channels in a 3D-NAND sample, either the surface fiducial or the feature on the exposed sample surface may be out-of-focus in the SEM image if the depth of the exposed sample surface exceeds the e-beam's focal length. As a result, distance between the feature and surface fiducial cannot be accurately determined from the SEM image.

Figure 2:
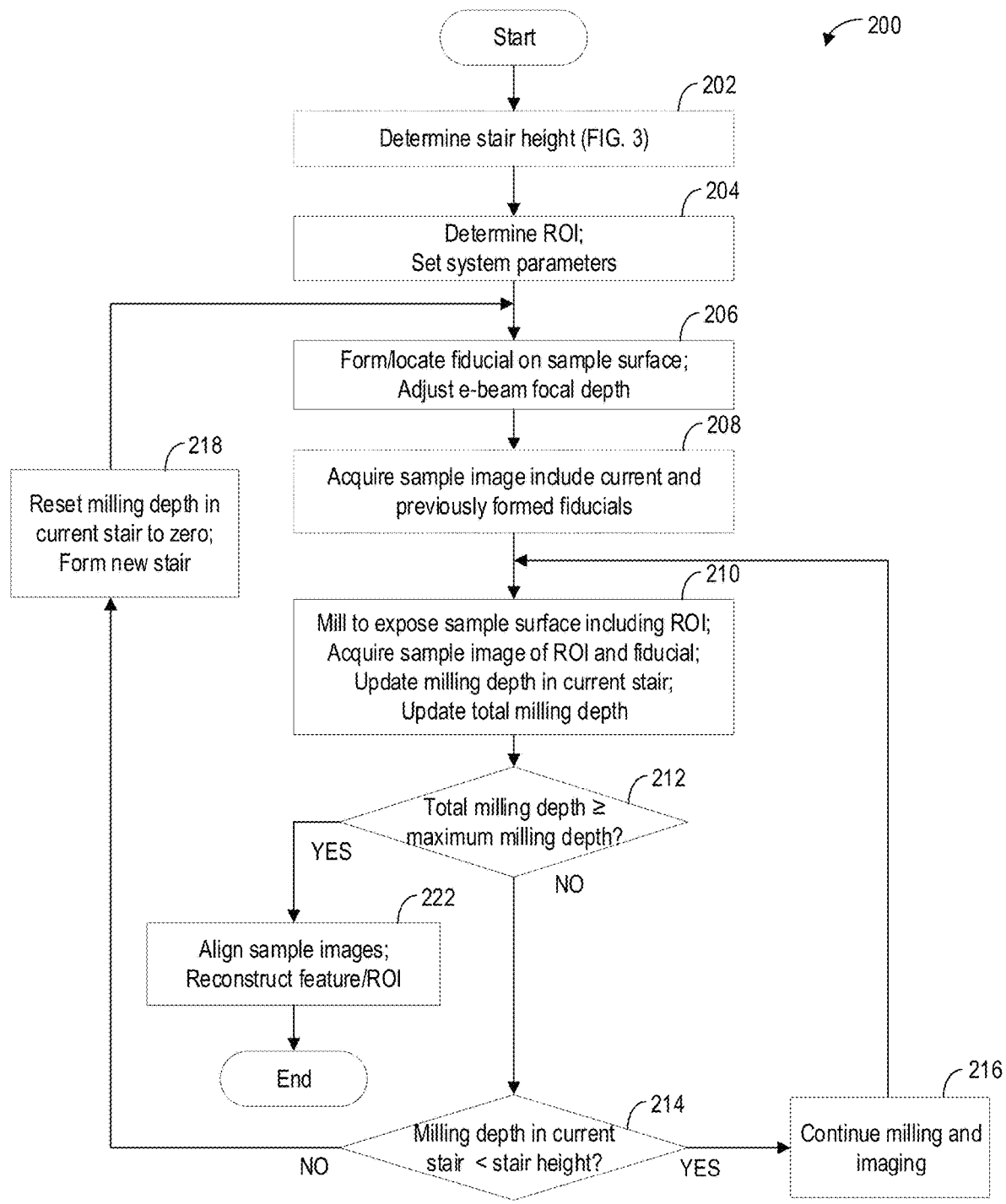
FIG. 2 is a method of reconstructing a feature within a sample.
Figure 3:
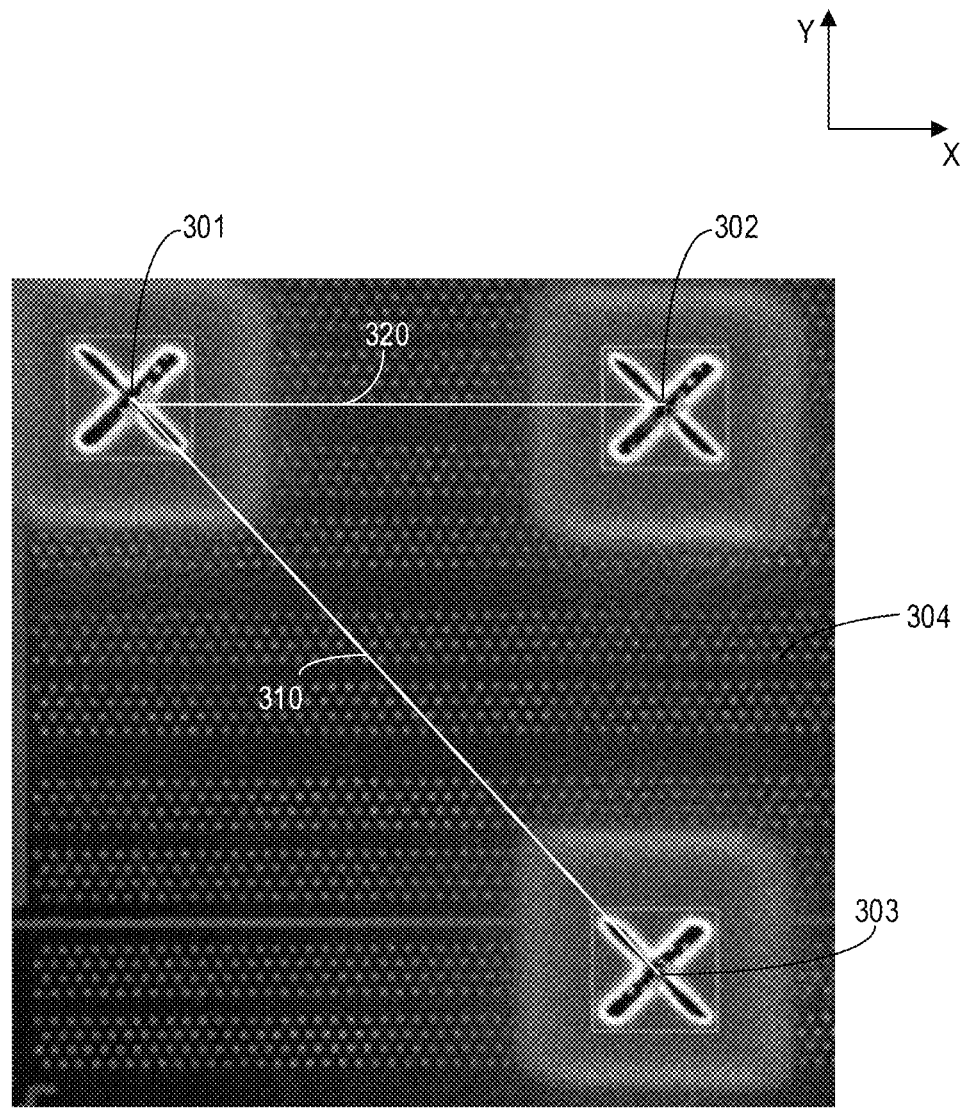
FIG. 3 illustrates multiple fiducials on a sample surface for determining a layer thickness.

FIG. 2 presents a method to address the above issue. Multiple fiducials are formed at different sample depths while removing layers of materials in a depth direction of the sample. The removed layers extending in planes perpendicular to the depth direction. The sample's top surface may be in the sample plane (XY plane according to the sample axes). For example, a first fiducial, such as a surface fiducial, is located or formed at a different location from a region of interest (ROI) on the sample's top surface. Herein, the ROI (or volume of interest) is defined as a 3D volume of the sample. The area of the ROI in the sample plane may change with sample depth. The ROI may include a feature of interest. The feature may be a profile or an area. The surface fiducial may be formed by FIB deposition or milling. Alternatively, the surface fiducial may be located by assigning a unique feature on sample's top surface as the surface fiducial. After removing at least a portion of the first sample surface to expose the ROI on a second sample surface at a second sample depth, a second fiducial is located or formed. The removed portion of the first sample surface does not include the first fiducial. The second fiducial is at a different location from the first fiducial in the sample plane. In one example, the second fiducial includes a boundary (or edge) formed between the second sample surface and the remaining portion of the first sample surface. In another example, the second fiducial is etched and/or deposited on the second sample surface with FIB. At least a portion of the second sample surface is then removed to expose ROI at a third sample depth on a third sample surface. The first SEM image including both the second fiducial and the ROI at the third sample depth is acquired with e-beam at a first focal depth. Location of the ROI at the third sample depth relative to the second fiducial may be obtained from the first SEM image. In one example, the first SEM image is acquired by scanning the e-beam in a single field of view (FOV). Herein, the FOV of a SEM image is the sample area scanned by the e-beam in a single scan. In another example, the first SEM image is stitched from multiple SEM images acquired at the first focal depth. The FOV of any one of the multiple SEM images overlaps the FOV of at least another SEM image, so that the multiple SEM images may be stitched together accurately by matching signals in the overlapped region. In this way, a continuous area in the sample plane including the second fiducial and the ROI at the third sample depth is imaged in the first SEM image. Location of the ROI at the third sample depth relative to the first fiducial in the sample plane is determined based on the location of the ROI relative to the second fiducial and the location of the second fiducial relative to the first fiducial in the sample plane. The location of the second fiducial relative to the first fiducial may be obtained from a second SEM image includes both the first and second fiducials. The first and second SEM images are taken with different focal depths, so that both the fiducial and the ROI in the SEM images are in-focus for accurate feature locating and high-resolution feature imaging. The second SEM image may be taken before milling the second sample surface, or after exposing the third sample surface. The difference between the first sample depth and the second sample depth may be determined based on the focal length of the e-beam or determined experimentally by imaging multiple fiducials on a sample surface, as shown in FIG. 3. More fiducials may be formed to expose the ROI deep in the sample. The milled sample resemble a staircase including multiple stairs, such as the milled sample shown in FIGS. 4A-4B and FIG. 5A. The stair height may be the same for each stair of the staircase, and each fiducial corresponds to one stair. In this way, relative location of the ROI at large sample depth from a surface fiducial may be accurately determined with minimal post-processing.

In another example, forming each stair in the sample includes removing multiple layers to expose multiple sample surfaces. SEM images of the multiple exposed sample surfaces are acquired to reconstruct features within the sample. Specifically, a first fiducial is formed or located at the first sample depth, such as on the sample's top surface. As material is milled or removed along the depth direction from the first sample depth to a second, greater, sample depth, multiple first sample images of exposed sample surfaces are acquired. Each of the first sample images includes the first fiducial and the ROI at the corresponding sample depth. The first sample images are acquired using a first focal depth of the e-beam. Location of the ROI between the first sample depth and the second sample depth relative to the first fiducial may be determined from the first sample images. Once the depth of the exposed sample surface (such as the total milling depth) reaches the second sample depth, a second fiducial is located. In one example, the second fiducial may be formed on a second sample surface at the second sample depth using the charged particle beam. In another example, the second fiducial may be formed while milling the sample from the first sample depth to the second sample depth. The second fiducial may be an edge or boundary formed while milling the sample from the first depth to the second sample depth. The depth difference between the first and the second sample depth is the stair height. The stair height is determined either experimentally or based on system parameters. As material is milled or removed along the depth direction from the second sample depth to a third, greater, sample depth, multiple second sample images of the exposed sample surfaces including the ROI at various sample depths are acquired. The second fiducial is outside of the milled region in the sample plane. The second sample images are acquired using e-beam at a second focal depth. Each of the second sample images includes the second fiducial and the ROI. In one example, the location of the second fiducial relative to the first fiducial in the plane perpendicular to the sample depth is determined based on one or more of the second sample images including the first fiducial. In another example, the location of the second fiducial relative to the first fiducial in the plane perpendicular to the sample depth is determined based on a sample image including both the first fiducial and the second fiducial. Because both the second fiducial and the ROI in the second sample images are in-focus, location of the ROI relative to the second fiducial can be accurately determined. In this way, location of the ROI at a depth between the second sample depth and the third sample depth relative to the first fiducial may be determined based on the location of the ROI relative to the second fiducial, as well as the location of the second fiducial relative to the first fiducial.

Figure 6:
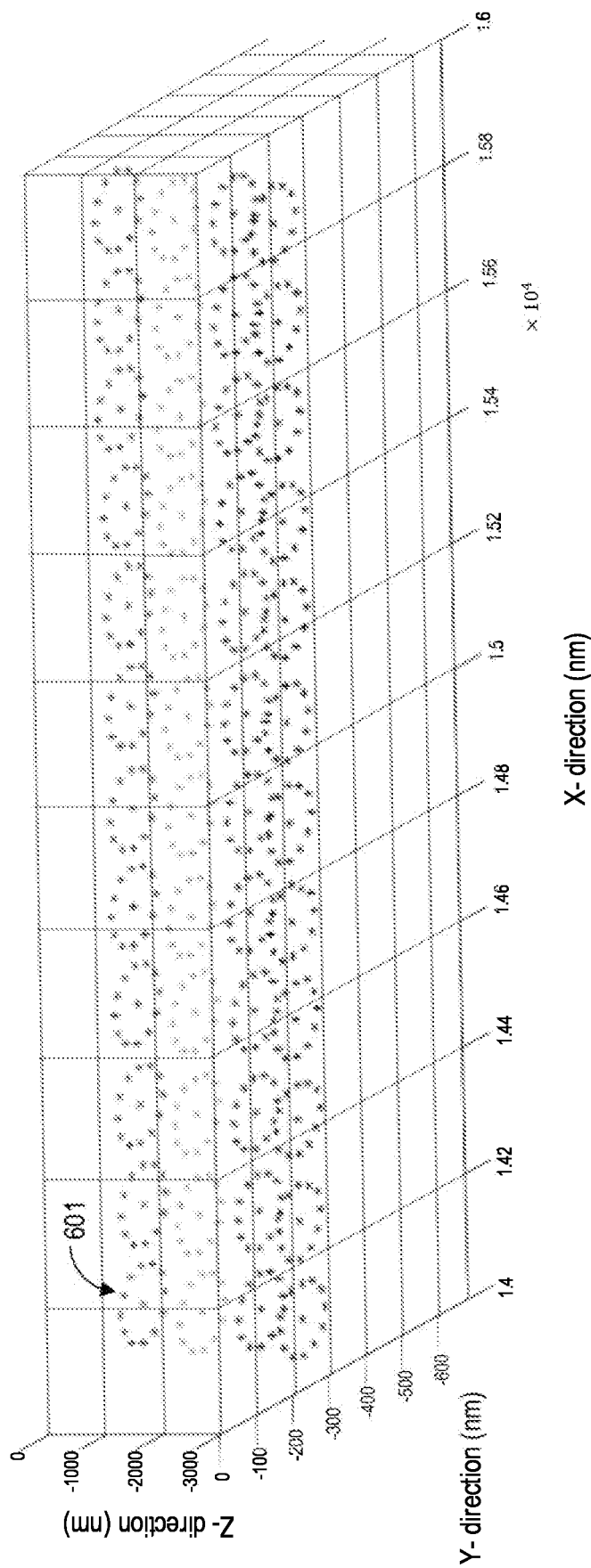
FIG. 6 is a three-dimensional profile of channels in a 3D-NAND sample reconstructed using the method of FIG. 2.

More stairs may be formed to image ROI deep in the sample. Each fiducial corresponds to a stair or a range of sample depth, wherein all SEM images of the exposed sample surfaces within the range include their corresponding fiducial. Further, each range of sample depth, or each stair, corresponds to a different focal depth of the e-beam for acquiring the SEM images. As such, in each of the SEM image, the ROI and at least one fiducial are imaged in-focus with high resolution. In some examples, the SEM image of the exposed sample surface is generated by stitching multiple SEM images acquired at the same e-beam focus depth and with overlapped FOV. The FOV of the multiple SEM images are overlapped such that FOV of any one of the multiple SEM images overlaps with the FOV of at least another one of the multiple SEM images. The stair height may depend on the property of the e-beam. The location of the ROI at a specific sample depth relative to the first fiducial is determined based on the location of the ROI from the most recently formed fiducial, as well as location of the most recently formed fiducial relative to the previous formed fiducials. The mostly recently formed fiducial may be the closest fiducial to the ROI on an exposed sample surface in the plane perpendicular to the sample depth. In one example, the ROI may be reconstructed by aligning the SEM images in a 3D space. The SEM images may be aligned based on least one of the fiducials that is in-focus in the respective SEM images, as well as their respective sample depth. In another example, the ROI may be reconstructed based on its position relative to the surface fiducial at various sample depths. In yet another example, 3D features within the ROI may be extracted from the reconstructed ROI. For example, as shown in FIG. 6, profiles of multiple channels of a 3D-NAND sample at various sample depths are reconstructed by aligning ROIs including the multiple channels based on the ROIs' distance from the surface fiducial.

Figure 1:
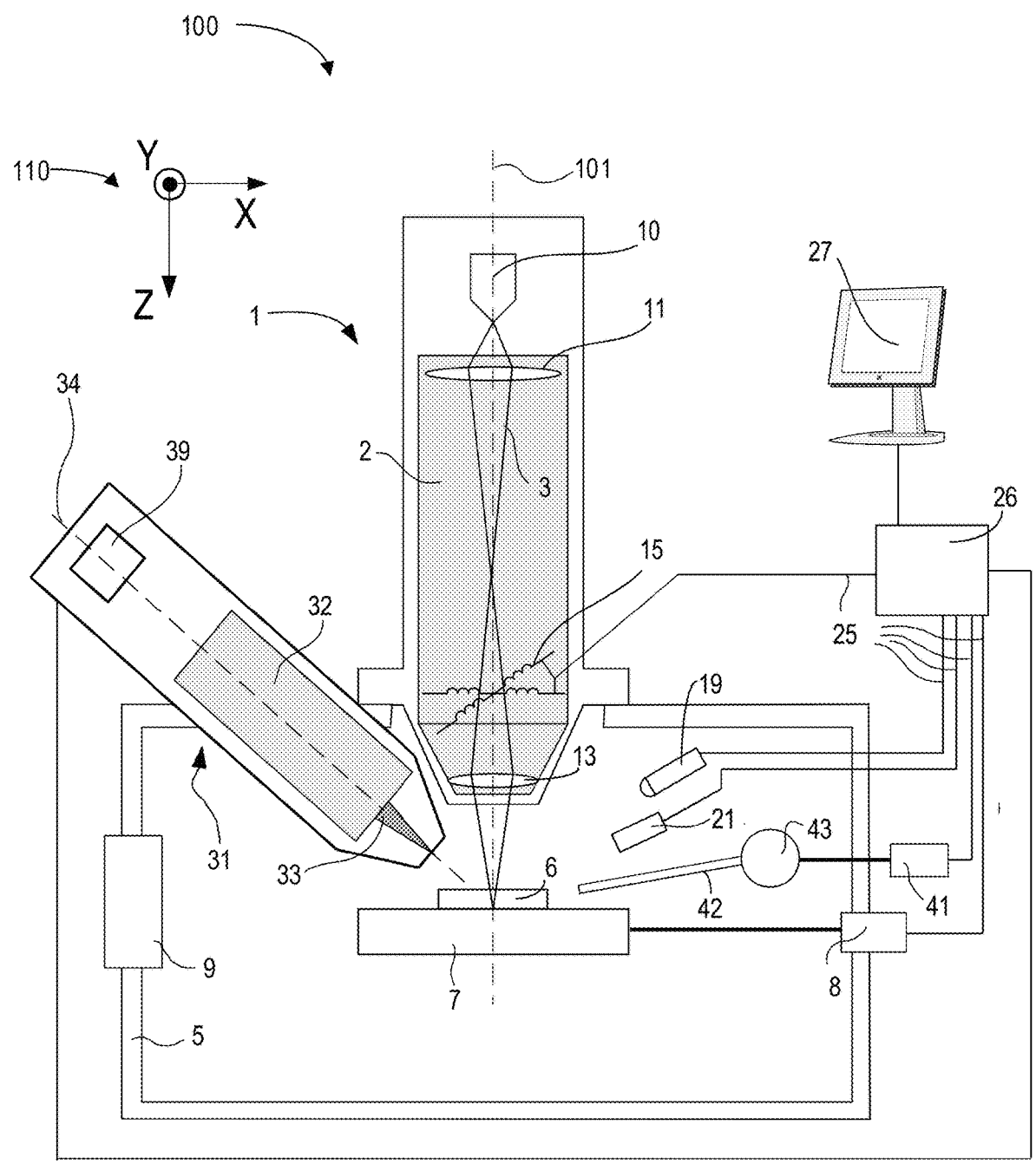
FIG. 1 shows a charged particle microscopy system.

Turning to FIG. 1, FIG. 1 is a highly schematic depiction of an embodiment of a dual-beam charged particle microscope (CPM) in which the present invention is implemented; more specifically, it shows an embodiment of a FIB-SEM. System axes are shown as axes 110. Microscope 100 comprises a particle-optical column 1, which produces a beam 3 of charged particles (in this case, an electron beam) that propagates along a particle-optical axis 101. Particle-optical axis 101 may be aligned with the Z axis of the system. The column 1 is mounted on a vacuum chamber 5, which comprises a sample holder 7 and associated actuator(s) 8 for holding/positioning a sample 6. The vacuum chamber 5 is evacuated using vacuum pumps (not depicted). With the aid of voltage supply 17, the sample holder 7, or at least the sample 6, may, if desired, be biased (floated) to an electrical potential with respect to ground. Also depicted is a vacuum port 9, which may be opened to introduce/remove items (components, samples) to/from the interior of vacuum chamber 5. Microscope 100 may comprise a plurality of such ports 9, if desired.

The column 1 (in the present case) comprises an electron source 10 and an illuminator 2. This illuminator 2 comprises lenses 11, 13 to focus the electron beam 3 onto the sample 6, and a deflection unit 15 (to perform beam steering/scanning of the beam 3). The microscope M further comprises a controller/computer processing apparatus 25 for controlling inter alia the deflection unit 15, lenses 11, 13 and detectors 19, 21, and displaying information gathered from the detectors 19, 21 on a display unit 27.

The detectors 19, 21 are chosen from a variety of possible detector types that can be used to examine different types of "stimulated" radiation emanating from the sample 6 in response to irradiation by the (impinging) beam 3. Detector 19 may be a solid state detector (such as a photodiode) that is used to detect cathodoluminescence emanating from the sample 6. It could alternatively be an X-ray detector, such as Silicon Drift Detector (SDD) or Silicon Lithium (Si(Li)) detector, for example. Detector 21 may be an electron detector in the form of a Solid State Photomultiplier (SSPM) or evacuated Photomultiplier Tube (PMT) for example. This can be used to detect backscattered and/or secondary electrons emanating from the sample 6. The skilled artisan will understand that many different types of detector can be chosen in a set-up such as that depicted, including, for example, an annular/segmented detector. By scanning the beam 3 over the sample 6, stimulated radiation—comprising, for example, X-rays, infrared/visible/ultraviolet light, secondary electrons (SEs) and/or backscattered electrons (BSEs)—emanates from the sample 6. Since such stimulated radiation is position-sensitive (due to said scanning motion), the information obtained from the detectors 19, 21 will also be position-dependent. This fact allows (for instance) the signal from detector 21 to be used to produce a BSE image of (part of) the sample 6, which image is basically a map of said signal as a function of scan-path position on the sample 6.

The signals from the detectors 19 and 21 pass along control lines (buses) 25, are processed by the controller 26, and displayed on display unit 27. Such processing may include operations such as combining, integrating, subtracting, false coloring, edge enhancing, and other processing known to the skilled artisan. In addition, automated recognition processes (e.g. as used for particle analysis) may be included in such processing. The controller includes a processor and a non-transitory memory for storing computer readable instructions. Methods disclosed herein may be implemented by executing the computer readable instructions in the processor.

In addition to the electron column 1 described above, the microscope 100 also comprises an ion-optical column 31. This comprises an ion source 39 and an illuminator 32, and these produce/direct an ion beam 33 along an ion-optical axis 34. To facilitate easy access to sample 6 on holder 7, the ion axis 34 is canted relative to the electron axis 101. As hereabove described, such an ion (FIB) column 31 can, for example, be used to perform processing/machining operations on the sample 6, such as incising, milling, etching, depositing, etc. Alternatively, the ion column 31 can be used to produce imagery of the sample 6. It should be noted that ion column 31 may be capable of generating various different species of ion at will, e.g. if ion source 39 is embodied as a so-called NAIS source; accordingly, references to ion beam 33 should not necessarily been seen as specifying a particular species in that beam at any given time—in other words, the beam 33 might comprise ion species A for operation A (such as milling) and ion species B for operation B (such as implanting), where species A and B can be selected from a variety of possible options.

Also illustrated is a Gas Injection System (GIS) 43, which can be used to effect localized injection of gases, such as etching or precursor gases, etc., for the purposes of performing gas-assisted etching or deposition. Such gases can be stored/buffered in a reservoir 41, and can be administered through a narrow nozzle 42, so as to emerge in the vicinity of the intersection of axes 101 and 34, for example.

It should be noted that many refinements and alternatives of such a set-up will be known to the skilled artisan, such as the use of a controlled environment within (a relatively large volume of) the microscope 100, e.g. maintaining a background pressure of several mbar (as used in an Environmental SEM or low-pressure SEM).

FIG. 2 shows a method 200 for reconstructing a feature within a sample using a charged particle microscopy system, such as the charged particle microscopy system of FIG. 1. Multiple fiducials are formed or located at different sample depths for accurately determining location of the feature or ROI at a large sample depth. In one example, a fiducial is formed after forming a stair by removing or milling multiple layers of the sample with the FIB. The height of the stair is determined either experimentally or based on the parameter of the imaging beam (such as the parameter of e-beam). A sample surface is exposed after removing or milling each layer. The exposed surfaces corresponding to the same stair are imaged with the same e-beam focal depth. In other words, sample surfaces corresponding to different stairs are imaged with different e-beam focal depths.

At 202, the stair height is optionally determined experimentally on a sample. The sample may be the same sample for the following slice-and-view process or another, different sample. The stair height may be determined by imaging multiple fiducials on the sample surface using the e-beam at various focal depths. For example, as shown in the SEM image of FIG. 3, three fiducials 301, 302 and 303 are formed by FIB depositing/milling of materials on sample's top surface 304. Location of each fiducial in the SEM image is determined by the location of the center of the fiducial (that is, the center of the cross). The three fiducials are imaged with the same FOV multiple times at different focal depths. At each focal depth, the distance between at least two of the fiducials is measured from the corresponding SEM image. For example, the first distance 310 between fiducials 301 and 303, as well as the second distance 320 between fiducials 301 and 302, are measured. As the three fiducials moves in and out of focus while adjusting the focal depth, the accuracy of fiducial location estimation changes. The fiducial location can be more accurately determined when the fiducials are imaged in-focus. As a result, the first and second distance measurements change with the change of focal depth. The range of focal depth within which the distance between at least two of the fiducials can be accurately measured may be set as the stair height. For example, the first distance 310 and the second distance 320 are first measured in a SEM image when the sample surface, or the multiple fiducials, are in focus. The focal depth of the e-beam is then increased to determine focal depth L1, at which the change of any one of the measured first and second distances from the in-focus measurement exceeds a threshold distance change. Similarly, the focal depth of the e-beam is decreased to determine focal depth L2, at which the change of any one of the measured first and second distances from the in-focus measurement exceeds the threshold distance change. The stair height is the difference between L1 and L2.

At 204, ROI including the feature of interest is determined. The ROI is a 3D volume of the sample. Based on location of the ROI, location of the surface fiducial on the sample surface may be determined. In one example, the maximum milling depth for milling and imaging may be determined based on the estimated size and structure of the ROI. In another example, the maximum milling depth may be determined based on the cross-sectional images of the ROI. Further, at 204, system parameters for milling and imaging are set. The system parameters may include beam parameters, such as beam energy and beam current for the FIB and the e-beam. The FIB beam parameters may be determined based on the sample type and sample material. FOV of the SEM image may be determined based on image resolution. The system parameters may also include the stair height, if the stair height has not been determined at 202. The stair height may be determined based on the focal length of the e-beam. For example, the stair height is proportional to the focal length of the e-beam.

At 206, a fiducial is formed or located on the sample surface. If step 206 is executed the first time, a surface fiducial is formed or located near the ROI on the sample's top surface. The surface fiducial may be a feature on the sample's top surface. Alternatively, the surface fiducial may be formed similar to the fiducials at 202, by milling or depositing materials using the FIB. If step 206 has been executed before, and the sample surface is an exposed sample surface resulted from milling by the FIB, the fiducial may be formed or located. In one example, the fiducial may be formed on the newly exposed sample surface by FIB milling or deposition. In another example, the fiducial may be formed during the milling process that created the stair. For example, as shown in the SEM image FIG. 5, the fiducial may be a portion of boundary 505 formed while milling from sample surface 501 to expose sample surface 502. Step 206 further includes adjusting the focal depth of the e-beam for imaging exposed sample surfaces corresponding to the subsequently formed stair through the loop 210-212-214-216. The e-beam focal depth may be adjusted so that the newly formed fiducial is in-focus. Adjusting the focal depth may include increasing the focal depth in the sample depth direction. The increasement may be the stair height.

At 208, if multiple fiducials have been formed or located on the sample, SEM image including the most recently formed two fiducials is optionally acquired. The two fiducials locate at different sample depths. For example, the depth difference between the two fiducials is the stair height. Relative position between the two fiducials may be determined based on the SEM image. In some examples, the SEM image may also include the ROI.

Steps 210, 212, 214, and 216 form a loop for delayering multiple layers until a stair is formed or the maximum milling depth is reached. After removing each layer, a SEM image including the ROI and the most recently formed fiducial at 206 is generated.

At 210, the sample is milled to remove a layer, and expose a sample surface including the ROI. SEM image of the ROI on the exposed sample surface and the fiducial most recently formed (i.e. current fiducial) in 206 is acquired. In one example, the SEM image is acquired with the ROI and the fiducial in the same FOV. In another example, the SEM image is generated by stitching multiple SEM images with overlapped FOVs. Each of the multiple SEM images is acquired with the same e-beam focal depth. The thickness of the removed layer may be determined based on stage current/image signal vs time graphs or a pre-determined slicing width. Based on the thickness of the removed layer, the milling depth within the current stair as well as the total milling depth (that is, the milling depth from sample's top surface) are updated. Further, the sample depth of the exposed sample surface and the sample image is determined.

At 212, method 200 compares the total milling depth with the maximum milling depth. The maximum milling depth may be determined at 204. Alternatively, the maximum milling depth may be determined based on the SEM image acquired at 210. If the total milling depth is less than the maximum milling depth, method 200 proceeds to 214. If the exposed surface depth is equal or greater than the maximum milling depth, the slice-and-view data collection is completed and method 200 proceeds to 222.

At 214, the milling depth in the current stair is compared with the stair height determined at 202 or 204. If the milling depth of the current layer is less than the stair height, method 200 continues the milling and SEM imaging process at 216. Otherwise, the current stair is completed and method 200 proceeds to 218 to form a new stair. Further, the milling depth in current stair is set to zero at 218.

At 222, the sample images may be aligned in the sample plane based on the fiducials. By aligning the sample images, 3D volume of the ROI can be reconstructed. In one example, aligning sample images includes aligning ROI at various sample depths. The ROI may be aligned based on the location of the ROI relative to the surface fiducial in the XY sample plane. The location of the ROI at a sample depth relative to the surface fiducial may be determined based on the SEM image of the exposed sample surface acquired at the sample depth, as well as the relative position of the fiducials. For example, as shown in the FIG. 5, location of the ROI 520 relative to the surface fiducial 510 is determined based on location of ROI 520 relative to fiducial 512 in the SEM image of sample surface 504, location of fiducial 512 relative to fiducial 511, and location of fiducial 511 relative to fiducial 510. In another example, the sample images are aligned by shifting the sample images in the XY plane so that locations of the same fiducial are aligned.

Moreover, one or more features within the ROI can be reconstructed at 222. The feature may be an area or a profile segmented from the SEM image. In one example, the feature is reconstructed by extracting the feature from the reconstructed 3D volume of the ROI. In another example, the feature is first extracted from reach of the SEM images and reconstructed by aligning the extracted features in the 3D space. The extracted features may be aligned in the XY sample plane based on the features' location relative to the surface fiducial. The extracted features may be aligned along the Z direction (sample depth) based on the sample depths of the corresponding sample surface. FIG. 6 shows reconstructed profile of multiple channels of a 3D-NAND sample. At a particular sample depth, the profile of a channel 601 is a circle. The shift in XY sample plane of each channel at different sample depths can be accurately measured due to accurate alignment of the channel profiles.

In this way, a feature (or ROI) of the sample may be reconstructed accurately with minimal image post-processing. The high precision alignment of the feature or the SEM images at various sample depths is achieved by accurately locating fiducial in the SEM image based on in-focus fiducial imaging. The XY location of ROI at large sample depth is estimated based on the location of ROI relative to the most recently located fiducial in the XY sample plane, as well as relative positions among the fiducials. The relative positions among the fiducials are measured based on locations of at least two fiducials that are imaged in-focus in the SEM image.

Figure 4A:
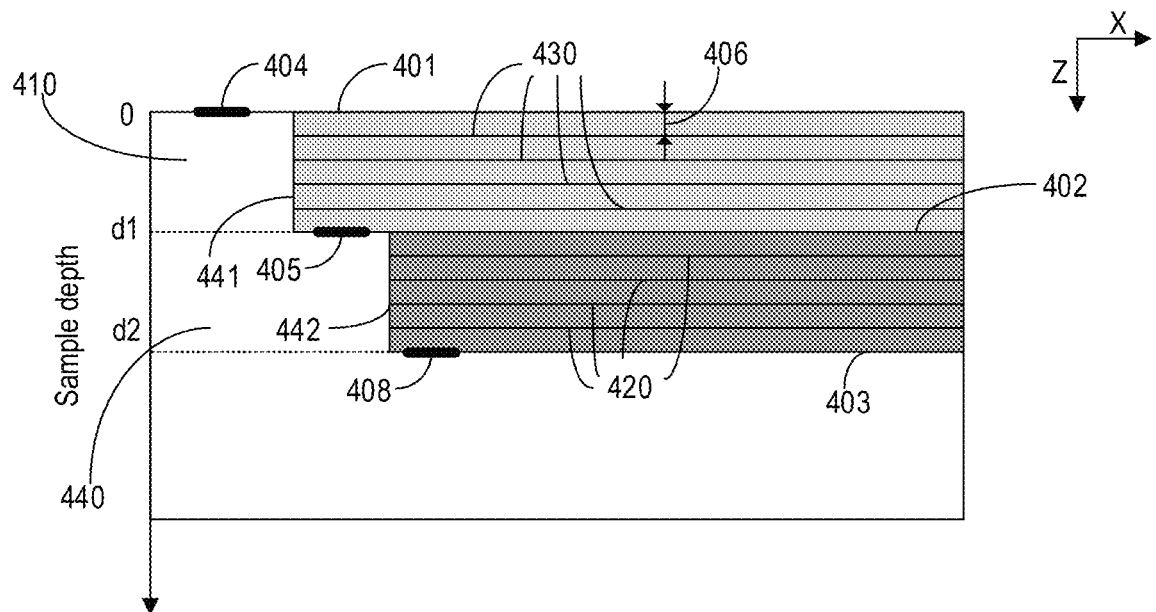
FIGS. 4A and 4B illustrate sample processed by the method of FIG. 2.
Figure 4B:
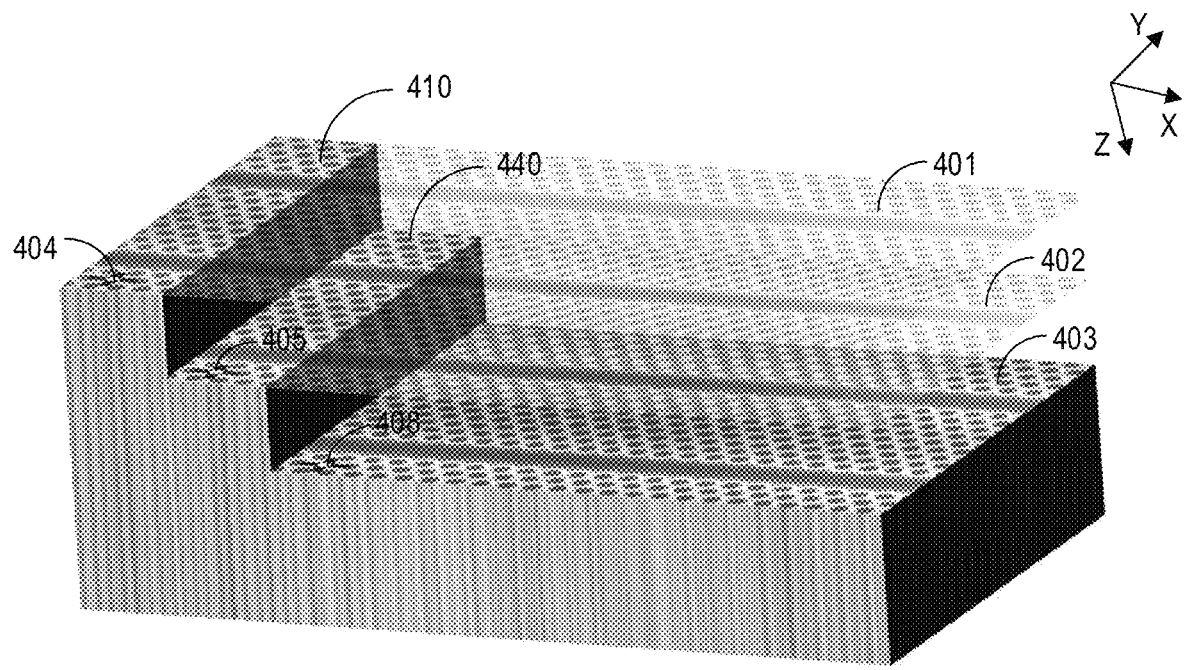

FIGS. 4A-4B show one example of the staircase created by the slice-and-view process of FIG. 2. The sample extends in the XY sample plane and has a sample depth along the Z axis. The sample depth increases in the direction of the Z axis. Herein, the sample's top surface 401 has a sample depth of zero. A surface fiducial 404 is formed on the top surface 401. The first stair 410 is formed by repetitively removing multiple first layers with layer thickness 406. After removing each of the first layers, a sample surface 430 is exposed for SEM imaging with e-beam at a first focal depth. Each of the SEM images includes the surface fiducial 404 and the exposed sample surface 430 at a sample depth not greater than d1. The first stair has a stair height d1 determined either experimentally or based on the e-beam property. After forming the first stair, second sample surface 402 is exposed, and fiducial 405 is formed on the second sample surface 402. The second stair is formed by removing multiple second layers. Multiple sample surfaces 420 and the third sample surface 403 are exposed. SEM images of the second fiducial 405 together with any one of the sample surfaces 420 and the third sample surface 403 may be imaged with e-beam at a second focal depth. Thickness of each of the second layer may be the same as the thickness of each of the first layer. Third fiducial 408 may be formed on the third surface 403 in order to mill and image the sample at a greater sample depth. As a result of the milling process, the sample has a staircase form shown in FIG. 4B. In some embodiments, instead of forming fiducials on the second sample surface and the third sample surface, boundaries 441 and 442 may be used as the second fiducial and the third fiducial, respectively.

FIG. 5A shows a SEM image 500 of a milled sample in the XY sample plane. Three fiducials 510, 511 and 512 are formed on first sample surface 501, second sample surface 502, and third sample surface 503. Sample depth increases from the first sample surface 501 to the fourth sample surface 504. Each of the sample surface extends in the XY sample plane. The fourth sample surface 504 and the third fiducial 512 are imaged in-focus. The location of ROI 520 on the fourth sample surface relative to the first fiducial 510 may be determined based on the location of the ROI 520 relative to the third fiducial 512 and the location of the third fiducial 512 relative to the first fiducial 510. Location of ROI 520 relative to the third fiducial 512 is determined based on a SEM image including the ROI and the third fiducial acquired at a third focal depth. The location of the third fiducial 512 relative to the first fiducial is determined based on a first location of the third fiducial 512 relative to the second fiducial 511 and a second location of the second fiducial 511 relative to the first fiducial 510. The first location is determined based on a SEM image including the third fiducial and the second fiducial acquired at a second focal depth, and the second location is determined based on a SEM image including the second fiducial and the first fiducial acquired at a first focal depth. The third focal depth is greater than the second focal depth. The second focal depth is greater than the first focal depth. In some embodiments, instead of forming the fiducial on the sample surface, the fiducial may be intrinsically formed during milling. For example, an area 505 including a portion of the boundary 506 formed while milling from the first sample surface to the second sample surface may be used as the second fiducial.

The SEM image in FIG. 5A may be obtained by stitching multiple SEM images with overlapped FOVs. For example, as shown in FIG. 5B, the SEM image of FIG. 5A may be obtained by stitching three SEM images 551, 552, and 553 with overlapped FOVs. SEM images 551 and 552 overlap in region 521, and SEM images 552 and 553 overlap in region 522. By matching signals in the overlapped regions 521 and 522, the three SEM images may be accurately stitched together.

Figure 7A:
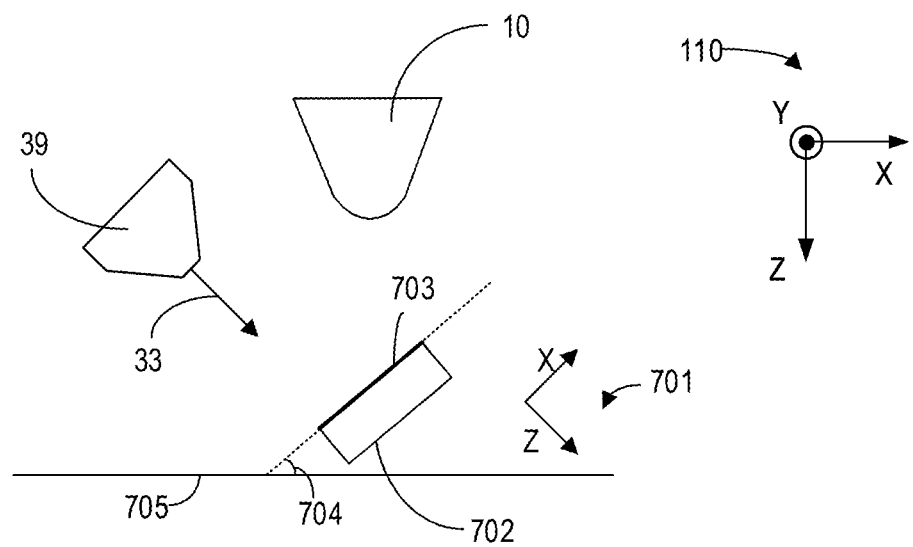
FIGS. 7A-7B show an example position of the charged particle beams and the sample.
Figure 7B:
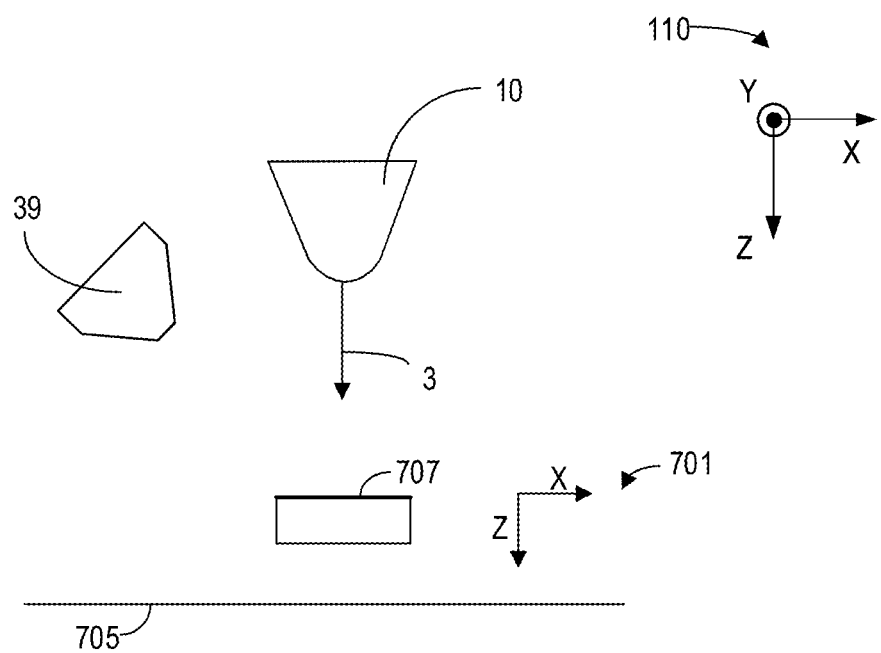

FIGS. 7A-7B and FIGS. 8A-8B show example positions of the FIB and e-beam relative to the sample. Sample orientation is indicated by axes 701 and the orientation of the dual beam system is indicated by system axes 110. FIG. 7A shows the sample surface 703 is tilted to an angle 704 relative to the XY system plane 705 of the dual beam system. The sample surface 703 is irradiated with FIB 33 generated from ion source 39. The incident angle of the FIB is less than 90 degrees. For example, the sample is milled with the FIB beam orientated orthogonally towards the sample surface. After milling and exposing a sample surface 707, the sample is tilted so that sample surface 707 is in XY system plane. The sample's Z axis (sample depth direction) is perpendicular to the XY system plane 705. SEM image is acquired with the e-beam 3 orientated orthogonally towards the exposed sample surface 707.

Figure 8A:
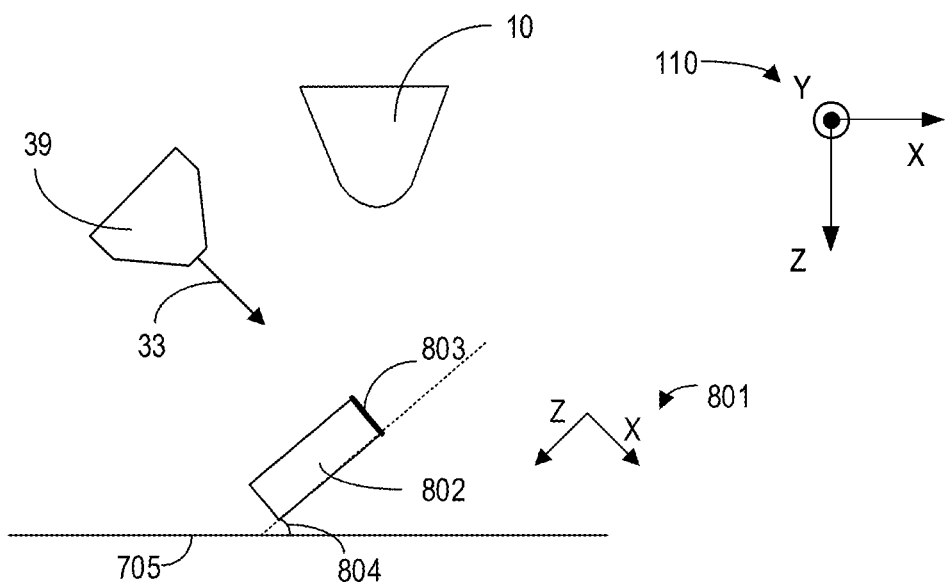
FIGS. 8A-8B show another example position of the charged particle beams and the sample.
Like reference numerals refer to corresponding parts throughout the several views of the drawings.
Figure 8B:
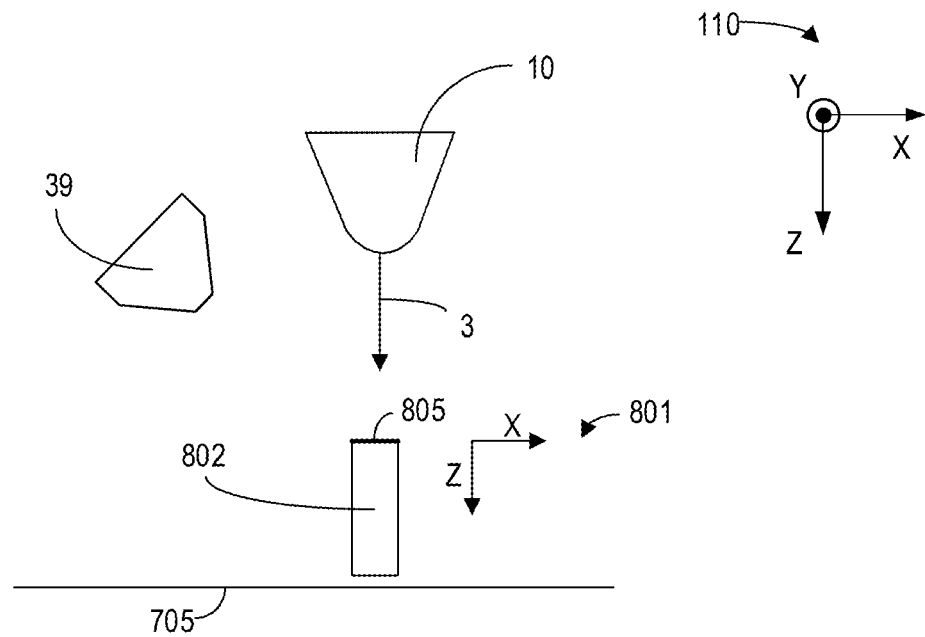

In FIGS. 8A-8B, for FIB milling, the sample 802 is orientated so that Z axis of the sample axis has an angle 804 relative to the XY system plane 705. Sample surface 803 is milled with FIB beam 33 with an incident angle greater than 90 degrees to expose sample surface 805. For sample, the FIB is orientated with a glancing angle of less than 10 degrees from the sample surface 803. The sample 802 is then orientated so that the Z axis of the sample axis 801 aligns with the Z axis of the system axis 101. Sample surface 805 is imaged using e-beam 3 with the e-beam orientated orthogonally towards the sample surface 805.

The technical effect for forming multiple fiducials at different sample depths is that the ROI's location relative to the surface fiducial may be derived based on relative locations of the fiducials and a SEM image including the ROI and at least one of the fiducials, wherein the ROI and the fiducial are in-focus in the SEM image. Further, location of feature deep in the sample can be accurately measured. The technical effect of in-focus SEM imaging the ROI and the fiducial is that the location between the ROI and the fiducial can be accurately measured.

What is claimed is:

1. A method for imaging a sample, comprising:
locating a first fiducial on a first sample surface at a first sample depth;
removing at least a portion of the first sample surface to expose a second sample surface;
forming a second fiducial on the second sample surface, wherein the second fiducial is formed during or after removing the portion of the first sample surface;
removing at least a portion of the second sample surface to expose a third sample surface including a region of interest (ROI) at a third sample depth;
acquiring a first sample image including the second fiducial and the ROI at the third sample depth; and
determining a location of the ROI at the third sample depth relative to the first fiducial in a sample plane perpendicular to a depth direction based on a first location of the first fiducial relative to the second fiducial in the sample plane and a second location of the ROI at the third sample depth relative to the second fiducial in the sample plane, wherein the second location is determined in the first sample image.

2. The method of claim 1, further comprising acquiring a second sample image including the first fiducial and the second fiducial; and determining the first location of the first fiducial relative to the second fiducial based on the second sample image.

3. The method of claim 2, wherein the first sample image is acquired with a charged particle beam at a first focal depth and the second sample image is acquired with the charged particle beam at a second, lower, focal depth.

4. The method of claim 3, further comprising:
acquiring a third sample image at a fourth sample depth between the first sample depth and the second sample depth with the charged particle beam at the second focal depth, wherein the third sample image includes the ROI at the fourth sample depth and the first fiducial;
determining a location of the ROI at the fourth sample depth relative to the first fiducial based on the third sample image; and
reconstructing the ROI from the first sample image and the third sample image by aligning the ROI at the first sample depth and the third sample depth based on the locations of the ROI at the third sample depth relative to the first fiducial and the ROI at the fourth sample depth relative to the first fiducial.

5. The method of claim 1, wherein the at least a portion of the first sample surface is removed with a first charged particle beam, the first sample image is acquired with a second charged particle beam, and the method further comprising determining a difference between the first sample depth and the second sample depth based on a focal length of the second charged particle beam.

6. The method of claim 1, wherein the at least a portion of the first sample surface is removed with a first charged particle beam, the first sample image is acquired with a second charged particle beam, and the method further comprising determining the second sample depth before removing the at least a portion of the first sample surface by imaging a distance between at least two fiducials at multiple focal depths of the second charged particle beam.

7. The method of claim 1, wherein the first sample surface is a top surface of the sample, the first fiducial is a feature on the top surface.

8. The method of claim 1, wherein the first fiducial is formed by depositing or etching the first sample surface with a focused ion beam.

9. The method of claim 1, wherein the second fiducial is formed while removing the at least a portion of the first sample surface to expose the second sample surface.

10. The method of claim 9, wherein the second fiducial includes a portion of a boundary between the first sample surface and the second sample surface.

11. A method for imaging a sample, comprising:
locating a first fiducial on a first sample surface at a first sample depth;
milling the sample from the first sample depth to a second sample depth to expose multiple first sample surfaces, and acquiring multiple first sample images including the first fiducial and a region of interest (ROI) on the exposed multiple first sample surfaces using a charged particle beam at a first focal depth, wherein each of the multiple first sample images corresponds to one of the multiple first sample surfaces from the first sample depth to the second sample depth;
locating a second fiducial, wherein the second fiducial is formed during or after removing the portion of the first sample surface;
milling the sample from the second sample depth to a third sample depth to expose multiple second sample surfaces including the ROI, and acquiring multiple second sample images including the second fiducial and the ROI on the exposed multiple second sample surfaces using the charged particle beam at a second, different, focal depth, wherein each of the multiple second sample images corresponds to one of the multiple second sample surfaces from the second sample depth to the third sample depth; and
reconstructing a feature in the ROI by aligning the multiple first sample images and the multiple second sample images based on locations of the first fiducial in the multiple first images, locations of the second fiducial in the multiple second images, and a location of the first fiducial relative to the second fiducial in a sample plane perpendicular to a depth direction.

12. The method of claim 11, further comprising acquiring a third sample image including the first fiducial and the second fiducial after milling the sample from the first sample depth to the second sample depth; and determining the location of the first fiducial relative to the second fiducial based on the third sample image.

13. The method of claim 11, wherein at least one of the multiple second sample images includes the first fiducial and the second fiducial, and the method further comprising determining the location of the first fiducial relative to the second fiducial based on the at least one of the multiple second sample images.

14. The method of claim 11, wherein reconstructing the feature includes extracting the feature from the ROI in each of the aligned multiple first sample images and the multiple second sample images, and reconstructing the feature based on the extracted feature and its corresponding sample depth.

15. The method of claim 11, further comprising:
locating a third fiducial; milling the sample from the third sample depth to a fourth sample depth to expose multiple third sample surfaces, and acquiring multiple third sample images including the third fiducial and the ROI on the multiple exposed third sample surfaces using the charged particle beam at a third focal depth, wherein each of the multiple third sample images corresponds to one of the multiple third sample surfaces from the third sample depth to the fourth sample depth; and reconstructing the feature by further aligning the multiple third sample images with the multiple first sample images.

16. The method of claim 11, wherein one or more of the first sample images and the second sample images are stitched together from multiple images, wherein a field of view of any one of the multiple images is overlapped with a field of view of at least another image of the multiple images.

17. A charged particle microscopy system, comprising:

a sample holder for positioning a sample;

an ion beam source for directing an ion beam towards the sample held by the sample holder;

an electron beam source for directing an electron beam towards the sample; and a controller includes a non-transitory memory for storing computer-readable instructions that when executed, causing the controller to:

locate a first fiducial on a first sample surface at a first sample depth;

remove at least a portion of the first sample surface to expose a second sample surface;

locate a second fiducial, wherein the second fiducial is formed during or after removing the portion of the first sample surface;

remove at least a portion of the second sample surface to expose a third sample surface including a region of interest (ROI) at a third sample depth;

acquire a first sample image including the second fiducial and the ROI at the third sample depth; and determine a location of the ROI at the third sample depth relative to the first fiducial in a sample plane perpendicular to a depth direction based on a first location of the first fiducial relative to the second fiducial in the sample plane and a second location of the ROI relative to the second fiducial in the sample plane, wherein the second location is determined in the first sample image.

18. The system of claim 17, wherein the controller is further configured to: acquire a second sample image including the first fiducial and the second fiducial; and determine the first location of the first fiducial relative to the second fiducial based on the second sample image.

19. The system of claim 18, wherein the second sample image further includes the ROI on the second sample surface, the second sample image is acquired before removing at least a portion of the second sample surface, and the controller is further configured to reconstruct the ROI based on the first sample image and the second sample image.

20. The system of claim 17, wherein the first sample image is acquired by scanning the electron beam within a field of view.

* * * * *

UNITED STATES PATENT AND TRADEMARK OFFICE
CERTIFICATE OF CORRECTION

| | | |
|---|---|---|
| PATENT NO. | : 11,694,322 B2 | Page 1 of 1 |
| APPLICATION NO. | : 17/177529 | |
| DATED | : July 4, 2023 | |
| INVENTOR(S) | : Zhenxin Zhong et al. | |

It is certified that error appears in the above-identified patent and that said Letters Patent is hereby corrected as shown below:

On the Title Page

In Column 1, below item (65):
Insert -- (30) Foreign Application Priority Data
Dec. 30, 2020 (CN) ........................................ 202011601367.0 --.

Signed and Sealed this
Fifteenth Day of August, 2023

Katherine Kelly Vidal
*Director of the United States Patent and Trademark Office*